US006448615B1

United States Patent
Forbes et al.

(10) Patent No.: US 6,448,615 B1
(45) Date of Patent: Sep. 10, 2002

(54) METHODS, STRUCTURES, AND CIRCUITS FOR TRANSISTORS WITH GATE-TO-BODY CAPACITIVE COUPLING

(75) Inventors: Leonard Forbes, Corvallis, OR (US); Wendell P. Noble, Milton, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/031,960

(22) Filed: Feb. 26, 1998

(51) Int. Cl.⁷ .............................................. H01L 29/76
(52) U.S. Cl. ...................................... 257/369; 257/350
(58) Field of Search ................................ 257/350, 369, 257/379, 532, 351

(56) References Cited

U.S. PATENT DOCUMENTS

| | | | | |
|---|---|---|---|---|
| 3,461,361 A | * | 8/1969 | Delivorias | 257/369 |
| 4,450,048 A | | 5/1984 | Gaulier | 204/15 |
| 4,521,448 A | | 6/1985 | Sasaki | 427/88 |
| 4,673,962 A | | 6/1987 | Chatterjee et al. | 357/23.6 |
| 4,751,561 A | * | 6/1988 | Jastrzebski | 257/350 |
| 4,922,315 A | | 5/1990 | Vu | 357/35 |
| 4,987,089 A | | 1/1991 | Roberts | 437/34 |
| 4,996,574 A | * | 2/1991 | Shirasaki | 257/66 |
| 5,006,909 A | | 4/1991 | Kosa | 357/23.6 |
| 5,021,843 A | * | 6/1991 | Ohmi | 257/401 |
| 5,097,381 A | | 3/1992 | Vo et al. | 361/313 |
| 5,122,848 A | | 6/1992 | Lee et al. | 357/23.6 |
| 5,250,450 A | | 10/1993 | Lee et al. | 437/40 |
| 5,315,143 A | | 5/1994 | Tsuji | 257/351 |
| 5,350,934 A | | 9/1994 | Matsuda | 257/139 |
| 5,379,255 A | | 1/1995 | Shah | 365/185 |
| H1435 H | * | 5/1995 | Cherne et al. | 257/351 |
| 5,428,237 A | * | 6/1995 | Yuzurihara et al. | 257/349 |
| 5,453,636 A | | 9/1995 | Eitan et al. | 257/378 |
| 5,488,236 A | | 1/1996 | Baliga et al. | 257/132 |
| 5,491,356 A | | 2/1996 | Dennison et al. | 257/306 |

(List continued on next page.)

FOREIGN PATENT DOCUMENTS

EP 0431855 * 7/1995

OTHER PUBLICATIONS

Yilmaz, H., et al., "Recent Advances in Insulated Gate Bipolar Transistor Technology", *IEEE Transactions on Industry Applications*, 26, 831–834 (Sep./Oct., 1990).

Wolf, S., *In: Silicon Processing for the VLSI Era, Volume 2: Process Integration*, Lattice Press, Sunset Beach, CA, 389–392, (1990).

Chen, M.J., et al., "Back–Gate Forward Bias Method for Low–Voltage CMOS Digital Cicuits", *IEEE Transactions on Electron Devices*, 43, 904–909, (Jun. 1986).

(List continued on next page.)

*Primary Examiner*—Mark V. Prenty
(74) *Attorney, Agent, or Firm*—Schwegman, Lundberg, Woessner & Kluth, P.A.

(57) ABSTRACT

Many integrated circuits, particularly digital memories, include millions of field-effect transistors which operate simultaneously and thus consume considerable power. One way to reduce power consumption is to lower transistor threshold, or turn-on, voltage, and then use lower-voltage power supplies. Although conventional techniques of lowering threshold voltage have enabled use of 2-volt power supplies, even lower voltages are needed. Several proposals involving a dynamic threshold concept have been promising, but have failed, primarily because of circuit-space considerations, to yield practical devices. Accordingly, the present invention provides a space-saving structure for a field-effect transistor having a dynamic threshold voltage. One embodiment includes a vertical gate-to-body coupling capacitor that reduces the surface area required to realize the dynamic threshold concept. Other embodiments include an inverter, voltage sense amplifier, and a memory. Ultimately, the invention facilitates use of half-volt (or lower) power supplies.

20 Claims, 6 Drawing Sheets

U.S. PATENT DOCUMENTS

| | | | |
|---|---|---|---|
| 5,508,544 A | 4/1996 | Shah | 257/316 |
| 5,528,062 A | 6/1996 | Hsieh et al. | 257/298 |
| 5,541,432 A * | 7/1996 | Tsuji | 257/350 |
| 5,581,104 A | 12/1996 | Lowrey et al. | |
| 5,585,998 A | 12/1996 | Kotecki et al. | 361/327.4 |
| 5,587,665 A | 12/1996 | Jiang | 326/16 |
| 5,646,900 A | 7/1997 | Tsukude et al. | 365/205 |
| 5,680,345 A | 10/1997 | Hsu et al. | 365/185.01 |
| 5,689,121 A | 11/1997 | Kitagawa et al. | 257/139 |
| 5,691,230 A * | 11/1997 | Forbes | 148/DIG. 50 |
| 5,714,413 A | 2/1998 | Brigham et al. | 438/301 |
| 5,796,143 A | 8/1998 | Fulford, Jr. et al. | 257/330 |
| 5,796,166 A | 8/1998 | Agnello et al. | 257/751 |
| 5,844,273 A | 12/1998 | Konishi | 257/331 |
| 5,892,260 A * | 4/1999 | Okumura et al. | 257/372 |
| 5,907,170 A | 5/1999 | Forbes et al. | 257/296 |
| 5,909,618 A | 6/1999 | Forbes et al. | 438/242 |
| 5,914,511 A | 6/1999 | Noble et al. | 257/302 |
| 5,936,274 A | 8/1999 | Forbes et al. | 257/315 |
| 5,969,388 A * | 10/1999 | Kishi | 257/369 |
| 5,973,356 A | 10/1999 | Noble et al. | 257/319 |
| 6,025,225 A | 2/2000 | Forbes et al. | 438/243 |

OTHER PUBLICATIONS

Chen, M.J., et al., "Optimizing the Match in Weakly Inverted MOSFET's by Gated Lateral Bipolar Action", *IEEE Transactions on Electron Devices*, 43, 766–773, (May 1996).

Chung, I.Y., et al., "A New SOI Inverter for Low Power Applications", *Proceedings of the 1996 IEEE International SOI Conference*, Sanibel Island, FL, 20–21, (Sep. 30–Oct. 3, 1996).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17, 509–511, (Nov. 1996).

Holman, W.T., et al., "A Compact Low Noise Operational Amplifer for a 1.2 Micrometer Digital CMOS Technology", *IEEE Journal of Solid–State Circuits*, 30, 710–714, (Jun. 1995).

Horiguchi, et al., "Switched–Source–Impedance CMOS Circuit for Low Standby Subthreshold Current Giga–Scale LSIs", *IEEE Journal of Solid State Circuits*, vol. 28, 1131–1135, (1993).

Huang, W.L., et al., "TFSOI Complementary BiCMOS Technology for Low Power Applications", *IEEE Transactions on Electron Devices*, 42, 506–512, (Mar. 1995).

Jaeger, et al., "A High–speed Sensing Scheme for 1T Dynamic RAMs Utilizing the Clamped Bit–line Sense Amplifier", *IEEE Journal of Solid State Circuits*, vol. 27, 618–25, (1992).

Ko, et al., "High–gain Lateral Bipolar Actionin a MOSFET Structure", *IEEE Trans. on Electron Devices*, vol. 38, No. 11, 2487–96, (Nov. 1991).

MacSweeney, D., et al., "Modelling of Lateral Bipolar Devices in a CMOS Process", *IEEE Bipolar Circuits and Technology Meeting*, Minneapolis, MN, 27–30, (Sep. 1996).

Parke, S.A., et al., "A High–Performance Lateral Bipolar Transistor Fabricated on SIMOX", *IEEE Electron Device Letters*, 14, 33–35, (Jan. 1993).

Rabaey, *Digital Integrated Circuits*, Prentice Hall, Englewood Cliffs, NJ, 222–232, (1996).

Seevinck, E., et al., "Current–Mode Techniques for High–Speed VLSI Circuits with Application to Current Sense Amplifier for CMOS SRAM's", *IEEE Journal of Solid–State Circuits*, 26, 525–536, (Apr. 1991).

Tsui, P.G., et al., "A Versatile Half–Micron Complementary BiCMOS Technology for Microprocessor–Based Smart Power Applications", *IEEE Transactions on Electron Devices*, 42, 564–570, (Mar. 1995).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Saito, M., et al., "Technique for Controlling Effective Vth in Multi–Gbit DRAM Sense Amplifier", *1996 Symposium on VLSI Circuits, Digest of Technical Papers*, Honolulu, HI, 106–107, (Jun. 13–15, 1996).

Shimomura, K., et al., "A 1V 46ns 16Mb SOI–DRAM with Body Control Technique", *1997 IEEE International Solid–State Circuits Conference, Digest of Technical Papers*, 68–69, (Feb. 6, 1997).

Tuinega, *A Guide to Circuit Simulation and Analysis Using PSPICE*, Prentice Hall, Englewood Cliffs, NJ, (1988).

Wong, et al., "A 1V CMOS Digital Circuits with Double–Gate Driven MOSFET", *IEEE Int. Solid State Circuits Conference*, San Francisco, 292–93, (1997).

\* cited by examiner

METHODS, STRUCTURES, AND CIRCUITS FOR TRANSISTORS WITH GATE-TO-BODY CAPACITIVE COUPLING

BACKGROUND OF THE INVENTION

The present invention concerns integrated circuits that include field-effect transistors, particularly metal-oxide-semiconductor field-effect transistors.

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic transistors, resistors, and other electrical components on a silicon substrate, known as a wafer. The components are then "wired," or interconnected, together to define a specific electric circuit, such as a computer memory.

Many integrated circuits include a common type of transistor known as a metal-oxide-semiconductor, field-effect transistor, or "mosfet" for short. A mosfet has four electrodes, or contacts—specifically, a gate, source, drain, and body. In digital integrated circuits, such as logic circuits, memories, and microprocessors which operate with electrical signals representing ones and zeroes, each mosfet behaves primarily as a switch, with its gate serving to open and close a channel connecting its source and drain. Closing the switch requires applying a certain threshold voltage to the gate, and opening it requires either decreasing or increasing the gate voltage (relative the threshold voltage), depending on whether the channel is made of negatively or positively doped semiconductive material.

Mosfets are the most common transistors used in integrated-circuit memories, because of their small size and low power requirements. Integrated-circuit memories typically include millions of mosfets operating simultaneously, to store millions of bits of data. With so many mosfets operating simultaneously, the power consumption of each mosfet is an important concern to memory fabricators. Moreover, as fabricators continually strive to pack more and more mosfets into memory circuits to increase data capacity, the need for even lower power and lower voltage mosfets compounds.

Conventional mosfets operate with power supply voltages as low as two volts. Although lower supply voltages are desirable, fabricators have reached a technical impasse based on their inability to make millions of mosfets with perfectly identical threshold voltages. Hence, each of the mosfets has its own unique threshold voltage, with some deviating only slightly from the fabricator's intended threshold voltage and others deviating significantly. The typical range of threshold voltages in memory circuits extends from 0.2 volts above to 0.2 volts below the intended threshold voltage.

Thus, for example, if fabricators build mosfets with an intended threshold of one-quarter volt to accommodate half-volt power supplies, some mosfets will actually have a threshold around 0.4 volts and others around 0.05 volts. In practice, these deviant mosfets are prone not only to turn on and off randomly because of inevitable power-supply fluctuations or electrical noise affecting their gate voltages, but also to turn on and off at widely variant rates. Therefore, to avoid random operation and promote uniform switching rates, fabricators raise the intended threshold to a higher level, which, in turn, forecloses the option of using lower power-supply voltages.

Recently, three approaches involving the concept of a dynamic, or variable threshold voltage, have emerged as potential solutions to this problem. But, unfortunately none has proven very practical. One dynamic-threshold approach directly connects, or shorts, the gate of a mosfet to its body causing the mosfet to have a lower effective threshold during switching and higher threshold during non-switching periods. (See, Tsuneaki Fuse et al., A 0.5V 200 MHZ 32 b ALU Using Body Bias Controlled SOI Pass-Gate Logic, IEEE International Solid State Circuits Conference, San Francisco, pp. 292–93, 1997.) However, this approach forces the mosfet to draw significant power even when turned off, in other words, to run continuously. This poses a particularly serious limitation for battery-powered applications, such as portable computers, data organizers, cellular phones, etc.

Louis Wong et al. disclose another dynamic-threshold approach which capacitively couples an n-channel mosfet's gate to its body. (See Louis Wong et al., A 1V CMOS Digital Circuits with Double-Gate Driven MOSFET, IEEE International Solid State Circuits Conference, San Francisco, pp. 292–93, 1997.) Implementing this approach requires adding a gate-to-body coupling capacitor to every mosfet in a memory circuit. Unfortunately, conventional integrated-circuit capacitors are planar or horizontal capacitors that consume great amounts of surface area on an integrated-circuit memory, ultimately reducing its data capacity.

The third dynamic-threshold approach, referred to as a synchronous-body bias, applies a voltage pulse to the body of a mosfet at the same time, that is, synchronous, with the application of a voltage to the gate, thereby reducing its effective threshold voltage. (See Kenichi Shimomuro et al., A 1V 46 ns 16 Mb SOI-DRAM with Body Control Technique, Digest of the IEEE International Solid-State Circuits Conference, San Francisco, pp. 68–69, 1997.) Unfortunately, implementing the circuitry to apply the synchronous voltage pulse requires adding extra conductors to carry the voltage pulses and possibly even built-in timing circuits to memory circuits. Thus, like the previous approach, this approach also consumes significant surface area and reduces data capacity.

Accordingly, there is a need to develop space-and-power efficient implementations of the dynamic threshold concept and thus enable the practical use of lower power-supply voltages.

SUMMARY OF THE INVENTION

To address these and other needs, embodiments of the present invention provide a space-saving structure and fabrication method for achieving gate-to-body capacitive coupling in n-and p-channel field-effect transistors. Specifically, one embodiment of the invention uses at least one vertical, that is, non-horizontal, capacitive structure, to achieve the gate-to-body capacitive coupling. In contrast to conventional horizontal capacitor structures, the vertical structure requires much less surface area. Moreover, for further space savings, another embodiment not only uses a lateral semiconductive surface of the transistor as a conductive plate of the gate-to-body coupling capacitor, but also places the other conductive plate in a normally empty isolation region between neighboring transistors. The space-saving gate-to-body capacitive coupling of the invention yields practical transistors with superior switching rates at low-operating voltages, ultimately enabling practical half-volt inverters, buffers, sense amplifiers, memory circuits, etc.

Another aspect of the invention concerns a method for making a field-effect transistor having gate-to-body capacitive coupling. One embodiment entails forming an NMOS or PMOS device island and then growing dielectric sidewalls on two opposing sidewalls of the NMOS or PMOS device island. Afterward, the method forms conductive sidewalls on the dielectric sidewalls. This method yields two vertical gate-to-body coupling capacitors, one on each of the two opposing sidewalls of the device island. In other embodiments, the method isolates the device island from an underlying substrate to form a silicon-on-insulator structure and forms self-aligned source and drain regions.

Still other aspects of the invention include circuits for half-volt inverters, voltage-sense amplifiers, and memories. Each incorporates a field-effect transistor having vertical gate-to-body capacitive coupling and thus offers not only space savings but also superior switching rate at low voltages.

DESCRIPTION OF THE PREFERRED EMBODIMENTS

The following detailed description, which references and incorporates FIGS. 1–10, describes and illustrates specific embodiments of the invention. These embodiments, offered not to limit but only to exemplify and teach the invention, are shown and described in sufficient detail to enable those skilled in the art to practice the invention. Thus, where appropriate to avoid obscuring the invention, the description may omit certain information known to those of skill in the art.

More specifically, this description includes four sections, a definition section that defines certain terms used throughout the description and three sections actually describing the invention. The first section describes a preferred embodiment of new structures for n-and p-type dynamic threshold transistors. The second section describes a preferred method of making these structures, and the third section describes several integrated-circuit applications for complementary dynamic threshold transistors.

Definitions

The description includes many terms with meanings derived from their usage in the art or from their use within the context of the description. As a further aid, the following term definitions are presented.

The term "substrate," as used herein, encompasses semiconductor wafers as well as structures having one or more insulative, semi-insulative, conductive, or semiconductive layers and materials. Thus, for example, the term embraces not only the silicon-on-insulator structure of this preferred embodiment, but also silicon-on-sapphire and other advanced structures. "Horizontal," as used herein, refers to a direction substantially parallel to a supporting surface of the substrate, regardless of substrate orientation. "Vertical," as used herein, generally refers to any direction that is not horizontal.

Figure 1A:
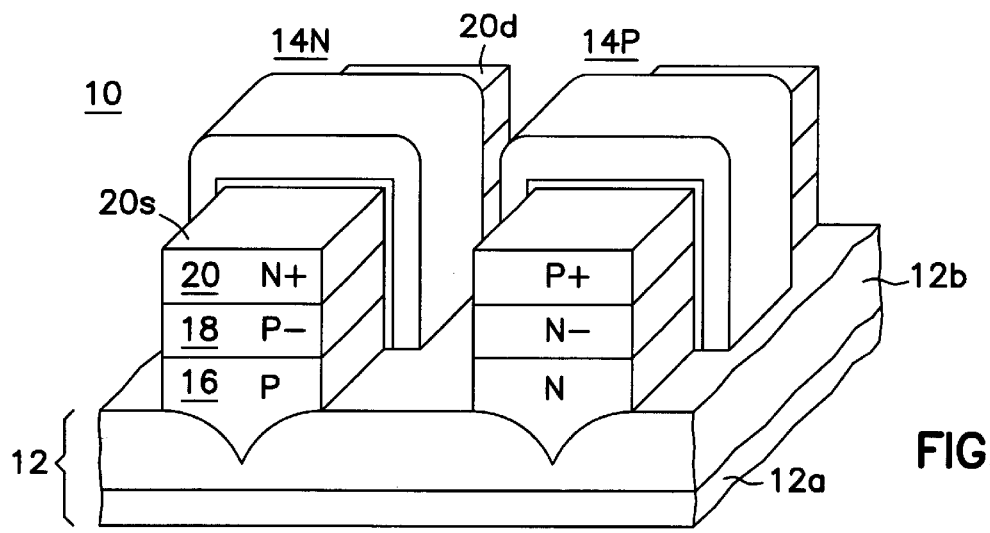
FIG. 1A is a perspective view of an integrated-circuit assembly for complementary field-effect transistors having gate-to-body capacitive coupling.
Figure 1B:
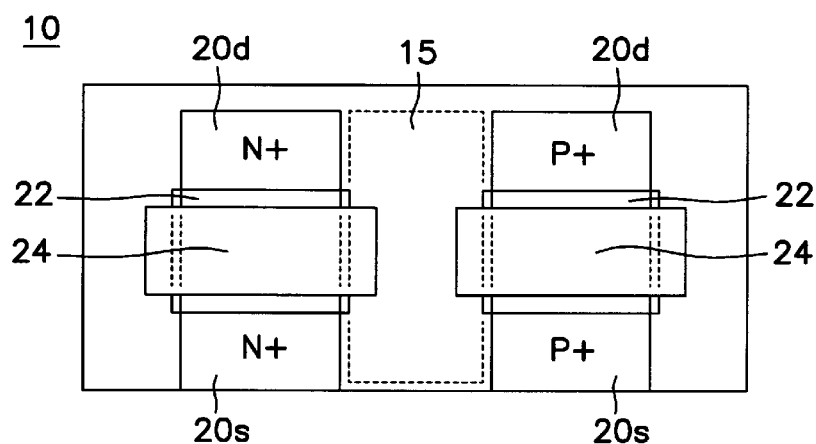
FIG. 1B is a top view of the FIG. 1A assembly.

Preferred Structure for Complementary Dynamic Threshold Transistors FIGS. 1A, 1 B, and 1C respectively show perspective, top, and side views of a preferred integrated-circuit assembly 10 comprising complementary n-and p-type dynamic threshold transistors 14N and 14P. Both transistors feature gate-to-body capacitive coupling implemented through transistor sidewall capacitors 26b and 26c (highlighted in FIG. 1C.) In the preferred embodiment, the capacitance of each sidewall capacitor is approximately equal to the transistor gate capacitance.

More specifically, assembly 10 includes a substrate 12 having two stacked, or superimposed, layers: a p-doped silicon layer 12a and a silicon dioxide insulative layer 12b. Supported on substrate 12 are respective NMOS and PMOS dynamic threshold transistors 14N and 14P. The transistors are separated on substrate 12 by isolation region 15, best illustrated in FIGS. 1B and 1C. Transistor 14N, which differs from transistor 14P only in terms of semiconductor doping, includes three layers of semiconductive material. The first layer, a p-type semiconductive body (or bulk) 16, contacts substrate 12, specifically insulative layer 12b. Atop p-type body 16 is a second layer 18 of lightly doped, p-type semiconductive material (P-), and atop layer 18 is a third layer 20 of heavily doped n-type semiconductive material (N+). Layer 20 has two regions 20d and 20s, which respectively serve as drain and source regions of transistor 14N. The drain and source regions are also shown in the top view of FIG. 1B.

Transistor 14N also includes an insulative saddle structure 22 atop layer 20. Saddle structure 22, shown best in the side view of FIG. 1C, has a middle region 22a that connects insulative sidewall regions 22b and 22c. Middle region (or section) 22a contacts a region of layer 20, the channel region, between drain and source regions 20d. And insulative sidewall regions 22b and 22c contact opposing lateral semiconductive surfaces of layers 16, 18, and 20. Middle region 22a functions as a gate insulator. In the preferred embodiment, insulative saddle structure 22 consists essentially of silicon dioxide or another electrical insulator.

Figure 1C:
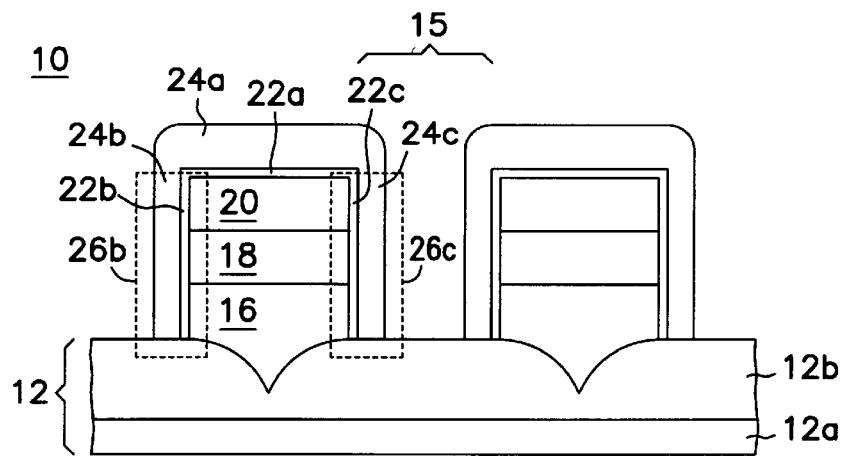
FIG. 1C is a front view of the FIG. 1A assembly.

Atop insulative saddle structure 22 is a conductive saddle structure 24, preferably formed of polysilicon. FIG. 1C shows that, like insulative saddle structure 22, conductive saddle structure 24 has a conductive middle region 24a connecting conductive sidewalls 24b and 24c. Conductive middle region 24a, which forms a gate region 24a of transistor 14, contacts middle region 22a of insulative saddle structure 22. Conductive sidewalls 24b and 24c contact respective insulative sidewalls 22b and 22c which space the conductive sidewalls from adjacent lateral surfaces of semiconductive layers 16, 18 and 20.

Conductive sidewalls 24b and 24c, together with corresponding insulative sidewalls 22b and 22c and the opposing lateral semiconductive surfaces of layers 16, 18, and 20 form respective twin vertical sidewall capacitors 26b and 26c. (In geometric terms, the vertical sidewalls define respective planes that intersect or are non-parallel to the supporting surface of substrate 12.) In the preferred embodiment, the sidewalls are substantially perpendicular, or normal, to the supporting surface. The conductive sidewalls 24b and 24c and semiconductive lateral surfaces of layers 16, 18, and 20 serve not only as parallel conductive plates of the twin vertical sidewall capacitors 26b and 26c, but also as conductive leads, connecting the vertical sidewall capacitors to gate region 24a, and thereby capacitively coupling gate region 24a of transistor 14N to its body layer 16. (Gate region 24a, gate insulator 22a, and semiconductive layer 20 also provide a gate capacitance.)

One advantage of the vertical sidewall construction of capacitor 26 is its use of space in the normally unused isolation region 15 between transistors 14N and 14P. Sidewall conductors 24b and 24c and respective insulative, or dielectric, layers 22b and 22c extend outwardly, or widthwise, from the lateral surfaces of the transistors into the isolation region. This arrangement, which essentially affixes or attaches the vertical capacitors to the sides of the transistors, consumes a minimum of substrate surface area. In contrast, a conventional integrated-circuit capacitor lies horizontally with its two conductive plates essentially parallel to a supporting substrate, and thus typically occupies a greater surface area to provide similar capacitance. Moreover, instead of requiring parallel plates separate from other features of the integrated circuit assembly, the present invention uses the existing lateral semiconductive surfaces of the transistor itself as a plate, providing not only further space savings but also fabrication savings.

Figure 1D:
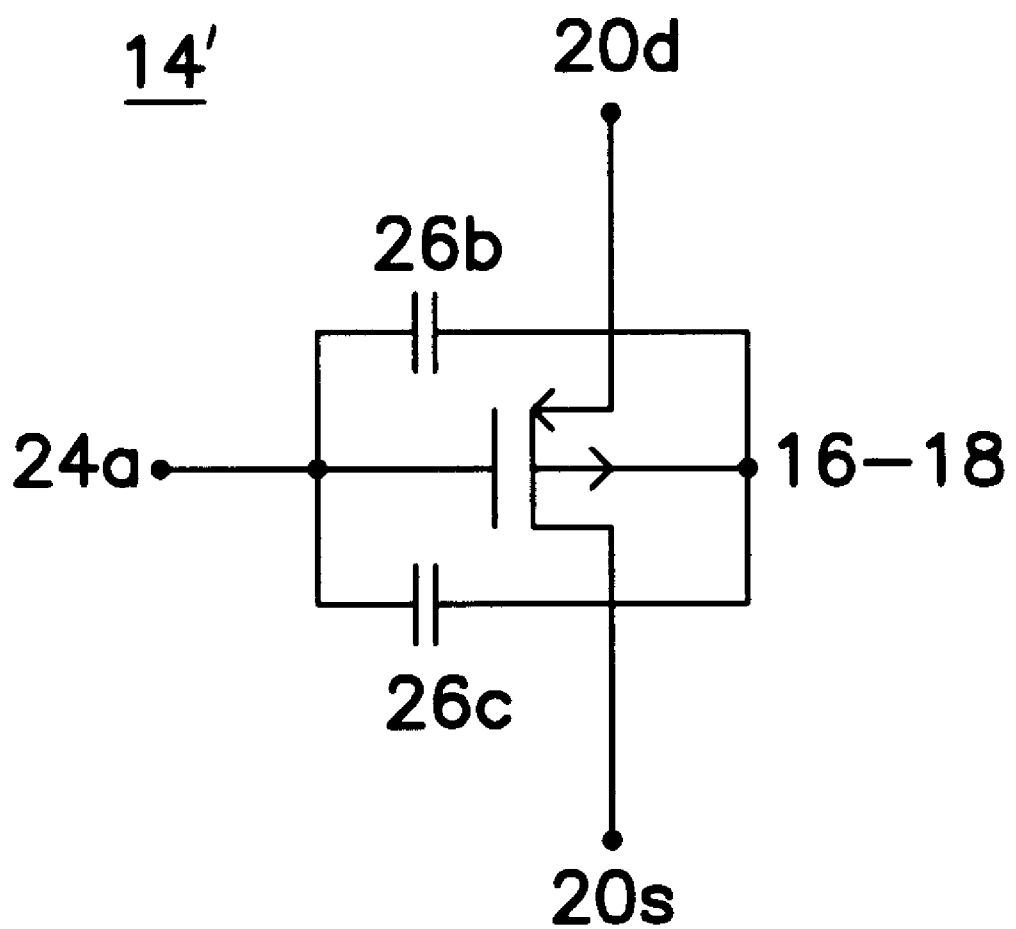
FIG. 1D is a schematic diagram showing an equivalent circuit for a portion of the FIG. 1A assembly.

FIG. 1D shows an equivalent circuit for the dynamic threshold transistors 14N and 14P. Notably, the gate-to-body coupling capacitance is shown as twin capacitors 26b and 26c to denote the preferred space-saving structure of the present invention. In operation, capacitors 26b and 26c appear as short circuits to a switching signal level at gate 24a and as open circuits when the signal reaches its steady-state level. As short circuits, the capacitors enable concurrent forward biasing of both the gate 24a (the frontgate) and the backgate formed by layers 18 and 16. Concurrent forward biasing of the frontgate and backgate effectively lowers threshold voltage relative to input voltage and thus accelerates activation of the transistor. In a sense, concurrent forward biasing forms the conductive channel region from front and back directions, thereby amplifying or accelerating the effect of a given gate voltage. Thus, in keeping with the dynamic threshold concept, the transistors 14N and 14P provide effectively lower thresholds during switching episodes and higher thresholds, based on conventional doping techniques, during steady state.

The Preferred Method of Making Complementary Dynamic Threshold Transistors

FIGS. 2–8 show a number of preferred integrated-circuit assemblies, which taken collectively and sequentially, illustrate a preferred method of making an integrated-circuit assembly substantially similar to space-saving assembly 10. Although the preferred method conforms to 0.2-micron CMOS technology, the exemplary dimensions are scalable, both upwardly and downwardly.

Figure 2:
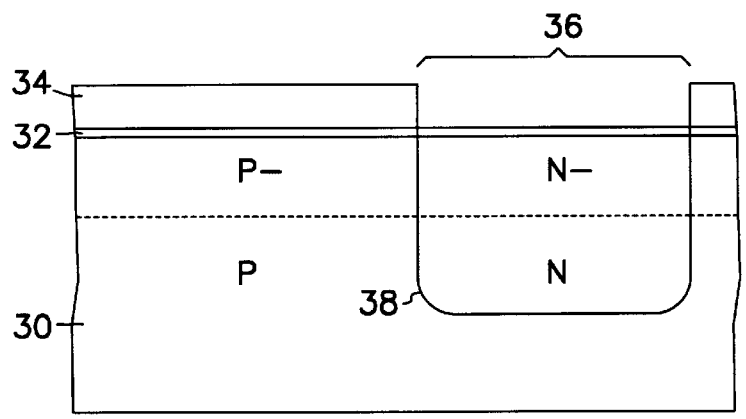
FIG. 2 is a cross-sectional view of an integrated-circuit assembly after formation of an n-well.

The first steps of the method form the integrated-circuit assembly of FIG. 2. These steps, which entail defining NMOS and PMOS device regions in a semiconductor substrate, start with a positively doped silicon substrate or wafer 30, form a thermal screen layer 32, preferably a 10-nanometer-thick layer of silicon dioxide on substrate 30, and then implant a p-type dopant into substrate 30 to a depth of about 0.4 microns. The implantation defines a retrograde doping profile, with dopant concentrations increasing with distance from the upper substrate surface. Next, the method defines an N-well device region 36 on p-doped silicon substrate 30 by applying photo resist mask 34 on thermal screen layer 32 and etching according to conventional techniques. The method then forms an n-well 38 within device region 36 by implanting an n-type dopant, again achieving a retrograde doping profile.

Figure 3:
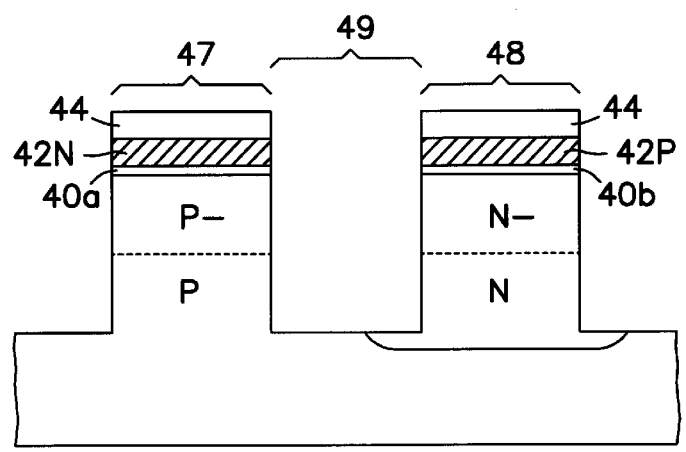
FIG. 3 is a cross-sectional view of the FIG. 2 assembly after formation of NMOS and PMOS device islands.

The next steps yield the integrated-circuit assembly of FIG. 3, which includes N-channel and P-channel device islands 47 and 48. Specifically, the method strips away mask 34 and screen layer 32, exposing n-well 38. The method next forms a gate isolation (or insulation) layer 40, preferably consisting of silicon dioxide. Subsequently, the method forms a heavily positively doped p-type (P+) gate region 42P and heavily positively doped n-type (N+) gate region 42N on respective regions 40N and 40P of gate isolation layer 40. Forming the gate regions entails forming a 0.1-micron-thick polysilicon layer over both the device regions, masking and doping gate region 42P and then masking and doping gate region 42N. A cap layer 44 of silicon nitride, approximately 0.1 micron thick, is then formed on the gate regions 42N and 42P, to protect them during subsequent steps.

Finally, to form device islands 47 and 48, which have respective pairs of opposing vertical sidewalls, the method applies an etch-resistant mask (not shown) defining the perimeter of the islands and then etches through cap layer 44, polysilicon gate regions 42P and 42N, gate oxide layer 40, and into substrate 30 approximately as deep as n-well 38. As FIG. 3 shows, device islands 47 and 48 are separated by an isolation region 49 (similar to region 15 shown in FIG. 1C.)

Figure 4:
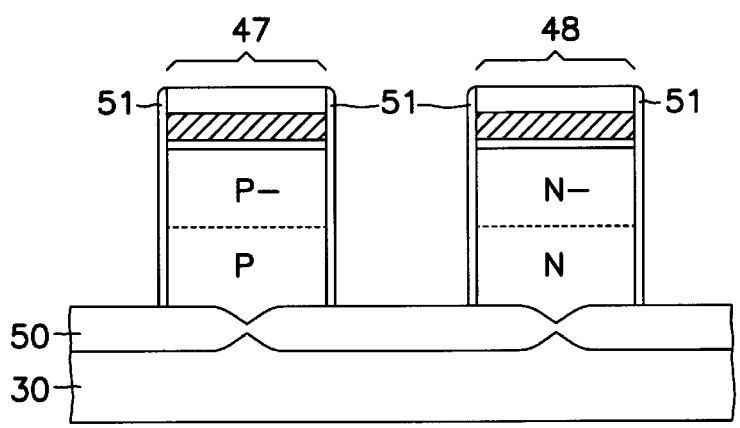
FIG. 4 is a cross-sectional view of the FIG. 3 assembly after isolating the device islands from underlying substrate.

FIG. 4 shows the results of the next steps which isolate NMOS and PMOS device islands 47 and 48 from underlying substrate 30 with an insulative layer 50 of silicon dioxide. Although there are a variety of techniques for achieving this isolation, the inventors prefer the Noble method disclosed in co-pending U.S. patent application Ser. No. 08/745,708 entitled "Silicon-on-Insulator Islands and Methods for Their Formation" filed on Nov. 12, 1996. Another method is disclosed in U.S. Pat. No. 5,691,230 entitled Technique for Producing Small Islands of Silicon on Insulator" issued Nov. 11, 1997 to Leonard Forbes. Both the application and the patent are assigned to the assignee of the present invention and incorporated herein by reference. A by-product of the Noble method is the formation of silicon nitride sidewalls 51 on device islands 47 and 48.

Figure 5:
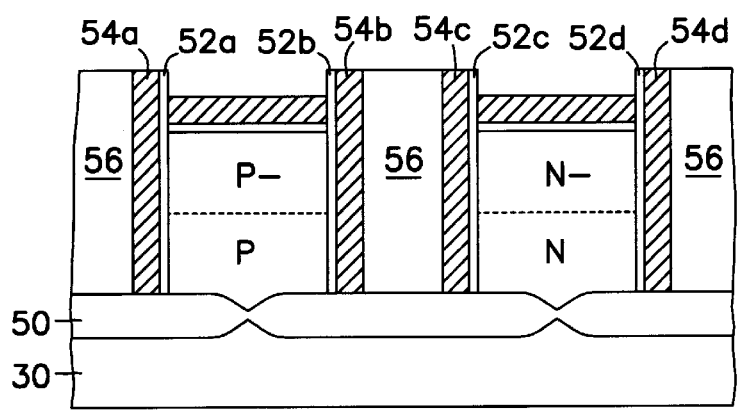
FIG. 5 is a cross-sectional view of the FIG. 4 assembly after formation of vertical sidewall capacitors on the NMOS and PMOS device islands.

As shown in FIG. 5, dielectric (or insulative) sidewalls 52a–52d are then formed on the device islands. In the preferred embodiment, forming the dielectric sidewalls entails first removing silicon nitride sidewalls 51 from the device islands and then growing silicon dioxide or other dielectric material on the sidewalls of the device islands. The preferred thickness of the dielectric sidewalls is the same as gate insulation layer 40, which is 5–10 nanometers.

After forming the dielectric sidewalls, the method forms respective conductive vertical sidewalls 54a–54d on corresponding dielectric sidewalls 52a–52d In the preferred method, making the vertical sidewalls entails depositing doped polysilicon and directionally etching the doped polysilicon to remove it from undesired areas, thereby leaving it only on the sidewalls of device islands 47 and 48.

Figure 6:
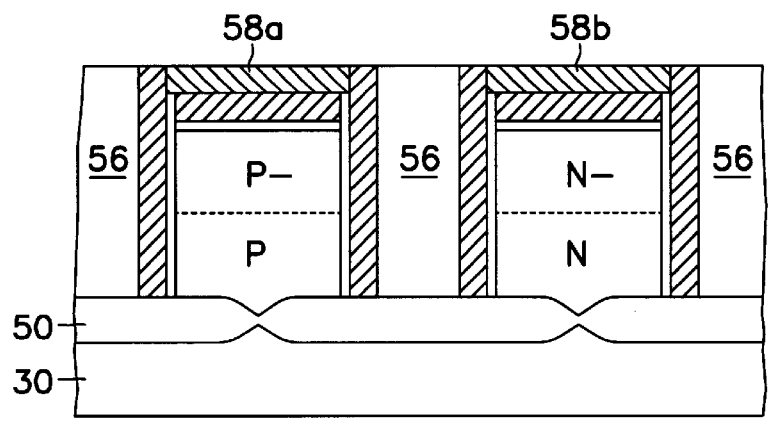
FIG. 6 is a cross-sectional view of the FIG. 5 assembly after formation of metal gate layers.

The regions between and around device islands 47 and 48 are then filled with a preferentially etchable material 56, such as intrinsic polysilicon, and subsequently planarized through chemical-mechanical planarization. After planarization, the method removes cap layer 44 to expose polysilicon gates 42P and 42N and top inside edges of vertical conductive sidewalls 54a–54d. In other words, removing cap layer 44 also entails removing the top most portion of the dielectric sidewalls to allow contact with the inside edges of the conductive sidewalls. Next, FIG. 6 shows that the method fills the resulting depressions over gates 42N and 42P with a refractory metal, preferably tungsten, to form contacts 58a and 58b.

Figure 7:
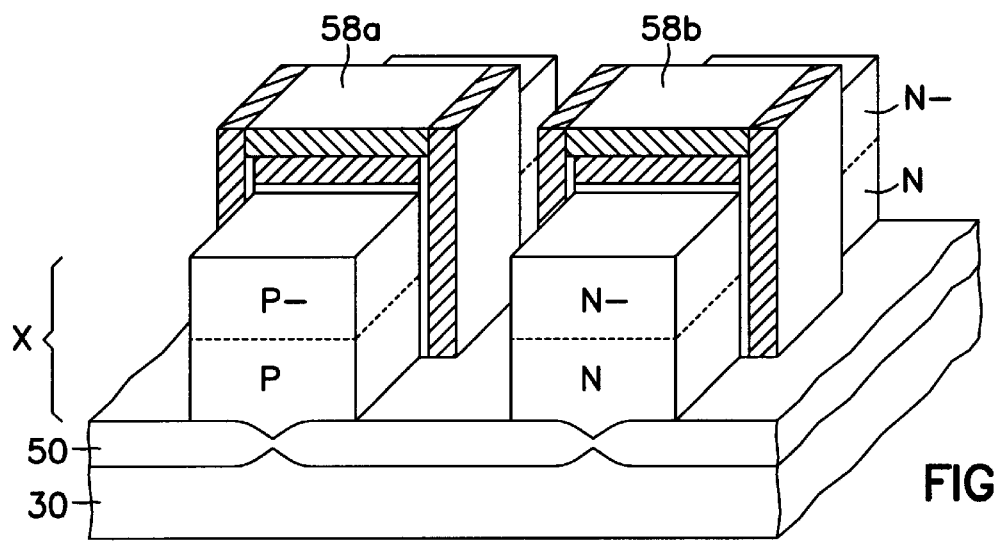
FIG. 7 is a perspective view of the FIG. 6 assembly after definition of metal gate members.

Following removal of excess refractory metal, the method defines drain and source region pairs 60a–60b and 60c–60d for respective device islands 47 and 48. This entails masking and etching through metal layer 58, through polysilicon gate regions 42P and 42N, through underlying gate insulation layer 40, and intrinsic polysilicon 56. After this, the method removes, preferably by gallic acid wet etching, remaining intrinsic polysilicon. The resulting structure is shown in the perspective of FIG. 7, which for sake of clarity omits intrinsic polysilicon 56.

Figure 8:
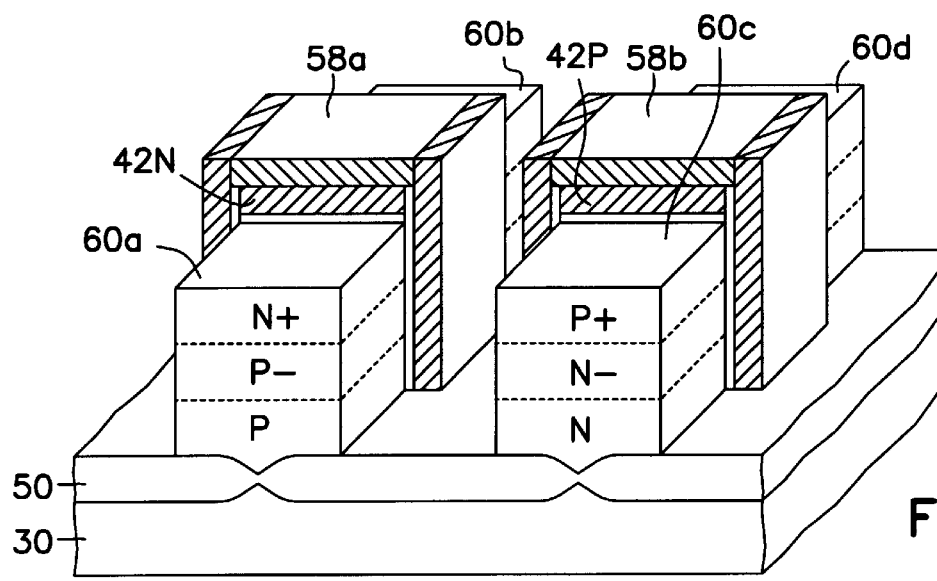
FIG. 8 is a perspective view of the FIG. 7 assembly after formation of the source and drain regions.

FIG. 8 shows the results of forming source and drain region pairs 60a–60b and 60c–60d in self-alignment with respective gates 42P and 42N, according to conventional procedures. Although not shown, further processing would entail conventional passivation and formation of contact holes and wiring to form a full integrated circuit, such as one or more of those described below.

Preferred Circuits For Dynamic Threshold Transistors

Figure 9:
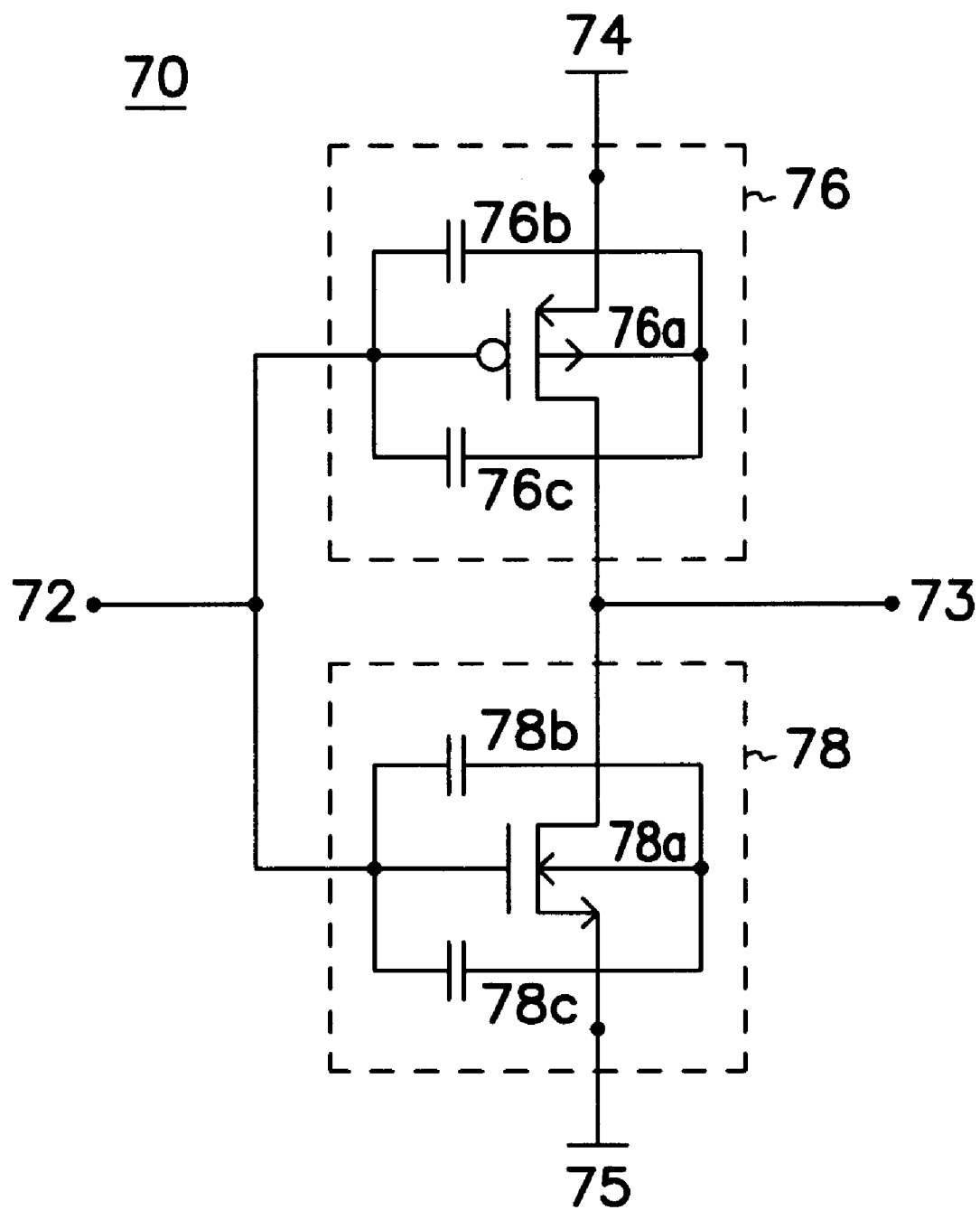
FIG. 9 is a schematic diagram of an inverter circuit incorporating the integrated-circuit structures of FIGS. 1A–1D and 8.
Figure 10:
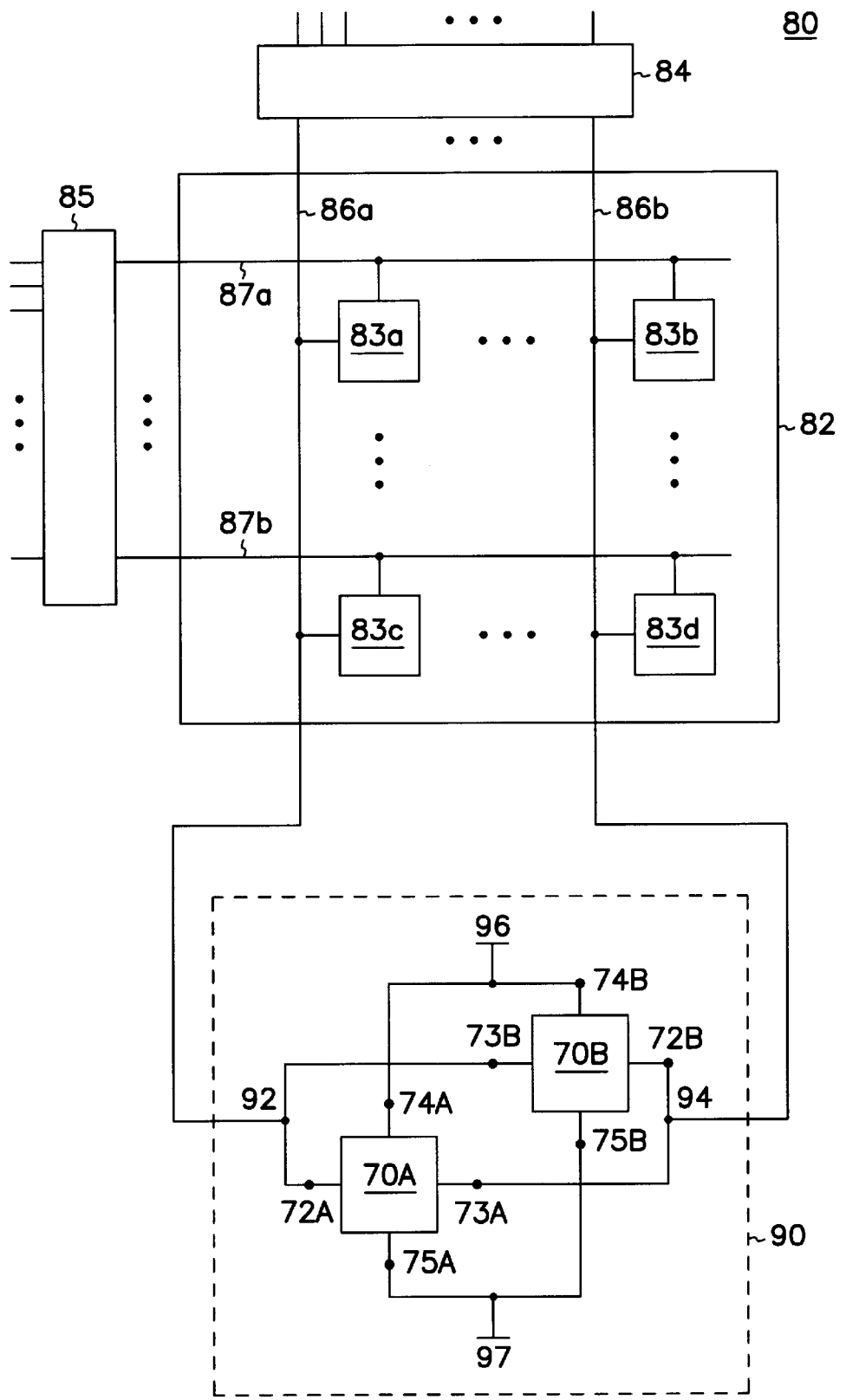
FIG. 10 is a schematic diagram of a memory circuit incorporating the inverter circuit of FIG. 9 as part of a voltage-sense amplifier.

The structure and/or method described above may be used to implement the circuits shown in FIGS. 9 and 10. FIG. 9 shows a logic inverter or buffer circuit 70 useful for pass-gate transistor logic or complementary pass-gate transistor logic, as an output driver or driver for an integrated circuit. Circuit 70 comprises respective input and output nodes 72 and 73 and voltage supply nodes 74 and 75. In the preferred embodiment, voltage supply node 74 provides a nominal voltage of one-half volt, and voltage supply node 75 provides a nominal voltage of zero volts.

Circuit 70 also includes respective NMOS and PMOS dynamic threshold transistors 76 and 78, which are preferably consistent with the space-saving structures and operating principles of integrated-circuit assembly 10 described above with the aid of FIGS. 1A–1D. Transistor 76 includes a field-effect transistor 76a having a gate, drain, source, and body, and twin gate-to-body coupling capacitors 76b and 76c. Similarly, transistor 78 comprises a field-effect transistor 78a and twin gate-to-body coupling capacitors 78b and 78c. The gates of transistors 76a and 78a are connected together to form input 72; and their drains are connected together to form output 73. The source of transistor 76a connects to supply node 74 and the source of transistor 78a connects to supply node 75.

In operation, circuit 70 performs as an inverter, providing a nominal half-volt output at output 73 in response to a nominal zero-volt input at input 72 and a zero-volt output in response to a half-volt input. However, gate-to-body coupling capacitors 76b–76c and 78b–78c play a significant role during input-voltage transitions.

More precisely, during positive input transitions (that is, from low to high), these capacitors approximate short circuits between the gates and bodies of transistors 76a and 78a, thereby forward biasing the backgate of (n-channel) transistor 78a, and reverse biasing the backgate of (p-channel) transistor 76a. Forward biasing the backgate of transistor 78a effectively lowers its threshold voltage relative the input voltage, and thus accelerates activation, or turn on, of transistor 78a. Consequently, the voltage at output 73 begins decreasing more rapidly toward the voltage at supply node 75, zero volts in the preferred embodiment. After switching, the gate-to-body capacitance discharges, thereby reverse biasing the backgate and restoring the threshold voltage. Similarly, a negative voltage transition at input 72 temporarily forward biases the backgate of (p-channel) transistor 76a and thus accelerates its activation and the associated increase in the output voltage toward the voltage at upper supply node 74, one-half volt in the preferred embodiment.

Estimates are that the gate-to-body capacitive coupling in circuit 70 will yield peak switching currents about five times larger than conventional low-voltage circuits lacking gate-to-body capacitive coupling. Ultimately, such peak-current increases translate into a three-fold increase in switching rates. Moreover, unlike previous efforts that directly shorted the gate and body to permanently forward bias the backgate junctions and thus drew current continuously, circuit 70 only forward biases the backgate junctions temporarily.

FIG. 10 illustrates a dynamic-random-access-memory (DRAM) circuit 80 suitable for one-half-volt (or lower) power-supply voltages. In addition to conventional DRAM features, such as a memory array 82 which comprises a number of memory cells 83, a column address decoder 84, and a row address decoder 85, and associated bit lines 86 and word lines 87, DRAM circuit 80 includes a novel voltage-sense-amplifier circuit 90 coupled in conventional fashion to bit lines 86.

Voltage-sense-amplifier circuit 90 includes two cross-coupled inverters 70A and 70B, each similar to circuit 70 shown in FIG. 9. Thus, the backgates or bodies of each inverter transistor are capacitively coupled to its input, thereby providing the circuit 80 with the peak switching current and switching rates advantages of circuit 70.

More specifically, circuit 90 further includes a bit-line node 92 coupled to a first bit-line 86a, and a bit-line node 94 coupled to a second bit line 86b, and two power supply nodes 96 and 97. Bit-line node 92 connects to input node 72A of circuit 70A, and output node 73B of circuit 70B. Bit-line node 94 connects to input node 72B of circuit 70B, and output node 73A of circuit 70A. Power supply nodes 96 and 97, which preferably provide respective nominal voltages of one-half and zero volts, are coupled to corresponding supply nodes 74A–74B and 75A–75B. With the exception of its dynamic thresholding which provides superior switching current and switching rate at low operating voltages, circuit 90 operates according to well-known and understood principles to sense data stored in memory cells 83.

Conclusions

The present invention provides a space-saving structure and fabrication method for achieving gate-to-body capacitive coupling in n-and p-channel transistors. Instead of using common horizontal capacitor structures to achieve the capacitive coupling, the invention uses vertical, that is, non-horizontal, capacitors, which require less substrate area. Moreover, the invention places these vertical capacitors in the isolation region between adjacent transistors. And, for even greater savings, the invention uses a lateral semiconductive surface (or sidewall) of the transistor as a conductive plate of the gate-to-body coupling capacitor. Furthermore, transistors incorporating gate-to-body capacitive coupling provide superior switching speed with low-operating voltages, ultimately enabling practical half-volt inverters, buffers, sense amplifiers, memory circuits, etc.

The embodiments described above are intended only to illustrate and teach one or more ways of implementing or practicing the present invention, not to restrict its breadth or scope. The actual scope of the invention, which includes all ways of implementing or practicing the invention, is defined only by the following claims and their equivalents.

What is claimed is:

1. An integrated circuit comprising:
   first and second complementary field-effect transistors having respective first and second gates and semiconductive bodies, with each semiconductive body having a source, a drain, a channel portion and a non-channel portion with the drain or source coupled to a supply node having a nominal voltage no greater than one-half volt and with the non-channel portion having a floating electrical potential;
   a first capacitance coupled between the first gate and the non-channel portion of the first semiconductive body; and
   a second capacitance coupled between the second gate and the non-channel portion of the second semiconductive body.

2. An inverter circuit comprising:
   first and second complementary field-effect transistors having respective first and second gates and bodies, with each body having a channel portion and a non-channel portion, with the non-channel portion of each body having a floating electrical potential and including first and second layers having different impurity concentrations and with the first and second gates coupled together;
   a first capacitance coupled between the first gate and the non-channel portion of the first body; and
   a second capacitance coupled between the second gate and the non-channel portion of the second body, with the first and second capacitances each comprising first and second capacitive structures coupled between the gate and the non-channel portion of its respective semiconductive body wherein at least one of the field-effect transistors has a drain or source coupled to a supply node having a nominal voltage no greater than one-half volt.

3. A voltage-sense-amplifier circuit comprising:
   first and second complementary field-effect transistors having respective first and second gates and respective first and second semiconductive bodies, each having a drain, a source, a channel portion and a non-channel portion, with the drain or source of the first semiconductive body coupled to the drain or source of the second semiconductive body, and with the non-channel portions of the first and second semiconductive bodies having respective floating electrical potentials;
   a first capacitance coupled between the first gate and non-channel portion of the first semiconductive body; and
   a second capacitance coupled between the second gate and non-channel portion of the second semiconductive body,
   wherein the first and second field-effect transistors are coupled between first and second voltage nodes having a voltage differential no greater than one-half volt.

4. An integrated dynamic-random-access-memory circuit comprising:
   a plurality of memory cells;
   an address decoder coupled to the plurality of memory cells;
   first and second complementary field-effect transistors having respective first and second gates and respective first and second semiconductive bodies, each having a drain, a source, a channel portion, and a non-channel portion, with the first and second gates coupled to at least one of the memory cells and with the non-channel portions of the first and second semiconductive bodies having respective floating electrical potentials; and
   first and second capacitances coupled respectively between the first gate and the non-channel portion of the first semiconductive body and between the second gate and the non-channel portion of the second semiconductive body.

5. A voltage-sense-amplifier circuit comprising:
   first and second complementary field-effect transistors having respective first and second gates and respective first and second semiconductive bodies, each having a drain, a source, a channel portion and a non-channel portion, with the drain or source of the first semiconductive body coupled to the drain or source of the second semiconductive body, and with the non-channel portions of the first and second semiconductive bodies having respective floating electrical potentials;
   a first capacitance coupled between the first gate and non-channel portion of the first semiconductive body; and
   a second capacitance coupled between the second gate and non-channel portion of the second semiconductive body,
   wherein the non-channel portion of each semiconductive body includes first and second portions having different impurity concentrations, with the first portion being between the second portion and the respective channel portion and with each capacitance comprising a conductive plate that confronts the first and second portions of the non-channel portion of the respective semiconductive body.

6. A voltage-sense-amplifier circuit comprising:
   first and second complementary field-effect transistors having respective first and second gates and respective first and second semiconductive bodies, each having a drain, a source, a channel portion and a non-channel portion, with the drain or source of the first semiconductive body coupled to the drain or source of the second semiconductive body, and with the non-channel portions of the first and second semiconductive bodies having respective floating electrical potentials;
   a first capacitance coupled between the first gate and non-channel portion of the first semiconductive body; and
   a second capacitance coupled between the second gate and non-channel portion of the second semiconductive body,
   wherein the non-channel portion of each semiconductive body includes first and second layers having different impurity concentrations, with the first layer being between the second layer and the respective channel portion and with each capacitance comprising a conductive plate that confronts the first and second layers of the non-channel portion of the respective semiconductive body.

7. A voltage-sense-amplifier circuit comprising:

first and second complementary field-effect transistors having respective first and second gates and respective first and second semiconductive bodies, each having a drain, a source, a channel portion and a non-channel portion, with the drain or source of the first semiconductive body coupled to the drain or source of the second semiconductive body, and with the channel portions of the first and second semiconductive bodies having lower impurity concentrations that those of the respective non-channel portions;

a first capacitance coupled between the first gate and non-channel portion of the first semiconductive body; and a second capacitance coupled between the second gate and non-channel portion of the second semiconductive body, wherein each non-channel portion has a dopant concentration that increases with distance from its respective gate.

8. The integrated circuit of claim 1 wherein the first and second capacitances each comprise first and second capacitive structures coupled between the gate and the non-channel portion of its respective semiconductive body.

9. The integrated circuit of claim 8 wherein the first and second capacitive structures are positioned on opposing sides of the corresponding transistor.

10. The integrated circuit of claim 8 wherein the first and second capacitive structures are located on opposing sides of the non-channel portion of the semiconductive body.

11. The circuit of claim 2 wherein the first and second capacitance structures are vertical structures.

12. The integrated circuit of claim 1, wherein the non-channel portion of each semiconductive body includes first and second portions having different impurity concentrations, with the first portion being between the second portion and the respective channel portion and with each capacitance comprising a conductive plate that confronts the first and second portions of the non-channel portion of the respective semiconductive body.

13. The integrated circuit of claim 1, wherein the non-channel portion includes first and second layers having different impurity concentrations, with the first layer being between the second layer and the respective channel portion and with each capacitance comprising a conductive plate that confronts the first and second layers of the non-channel portion of the respective semiconductive body.

14. The integrated circuit of claim 4 wherein the first and second capacitances each comprise first and second capacitive structures coupled in parallel between the gate and the non-channel portion of its respective semiconductive body.

15. The circuit of claim 1, wherein each non-channel portion has a dopant concentration that increases with distance from it respective gate.

16. The circuit of claim 1:

wherein each transistor further comprises a gate insulation layer between its gate and its channel portion, with the gate insulation layer having a thickness; and wherein each capacitance comprises a vertical dielectric structure transverse to the channel portions of the transistors, with the vertical dielectric having a thickness approximately equal to the thickness of the gate insulation layer.

17. The circuit of claim 2, wherein each non-channel portion has a dopant concentration that increases with distance from it respective gate.

18. The circuit of claim 2:

wherein each transistor further comprises a gate insulation layer between its gate and its channel portion, with the gate insulation layer having a thickness; and wherein each capacitance comprises a vertical dielectric structure transverse to the channel portions of the transistors, with the vertical dielectric having a thickness approximately equal to the thickness of the gate insulation layer.

19. The circuit of claim 4, wherein each non-channel portion has a dopant concentration that increases with distance from it respective gate.

20. The circuit of claim 4:

wherein each transistor further comprises a gate insulation layer between its gate and its channel portion, with the gate insulation layer having a thickness; and wherein each capacitance comprises a vertical dielectric structure transverse to the channel portions of the transistors, with the vertical dielectric having a thickness approximately equal to the thickness of the gate insulation layer.

* * * * *